United States Patent
Kim et al.

(10) Patent No.: US 9,842,644 B1
(45) Date of Patent: Dec. 12, 2017

(54) MEMORY DEVICE, OPERATION METHOD OF THE SAME, AND OPERATION METHOD OF MEMORY CONTROLLER

(71) Applicant: SK hynix Inc., Gyeonggi-do (KR)

(72) Inventors: Yong-Ju Kim, Seoul (KR); Sang-Gu Jo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/596,828

(22) Filed: May 16, 2017

(30) Foreign Application Priority Data

Jun. 8, 2016 (KR) .................. 10-2016-0070806

(51) Int. Cl.
*G11C 13/02* (2006.01)
*G11C 13/00* (2006.01)

(52) U.S. Cl.
CPC ........ *G11C 13/0033* (2013.01); *G11C 13/004* (2013.01); *G11C 13/0069* (2013.01); *G11C 13/0097* (2013.01)

(58) Field of Classification Search
CPC ................................ G11C 13/0033
See application file for complete search history.

(56) References Cited

U.S. PATENT DOCUMENTS

| | | | |
|---|---|---|---|
| 2013/0003451 A1 | 1/2013 | Bedeschi et al. | |
| 2015/0357035 A1* | 12/2015 | Kim | G11C 13/0033 365/148 |
| 2016/0189774 A1* | 6/2016 | Xie | G11C 13/0004 365/163 |
| 2016/0284399 A1* | 9/2016 | Mantegazza | G11C 13/004 |

FOREIGN PATENT DOCUMENTS

KR 1020160011488 2/2016

* cited by examiner

*Primary Examiner* — Hoai V Ho
*Assistant Examiner* — Jay Radke
(74) *Attorney, Agent, or Firm* — IP & T Group LLP

(57) ABSTRACT

A method for operating a memory device comprising a plurality of memory cells, the method may include: performing a first refresh operation comprising sequentially applying a recovery pulse to each of the plurality of memory cells and repeating the sequential application of the recovery pulse to each of the plurality of memory cells for a predetermined number of times; and performing a second refresh operation comprising sequentially re-writing data of each of the plurality of memory cells once after the first refresh operation is performed for the predetermined number of times.

20 Claims, 5 Drawing Sheets

MEMORY DEVICE, OPERATION METHOD OF THE SAME, AND OPERATION METHOD OF MEMORY CONTROLLER

CROSS-REFERENCE TO RELATED APPLICATIONS

The present application claims priority of Korean Patent Application No. 10-2016-0070806, filed on Jun. 8, 2016, which is incorporated herein by reference in its entirety.

BACKGROUND

1. Field

Exemplary embodiments of the present invention relate to a memory device, and a memory controller for controlling the memory device.

2. Description of the Related Art

Recently, the next-generation memory devices are being researched and developed to replace Dynamic Random Access Memory (DRAM) devices and flash memory devices. Among the next-generation memory devices is a resistive memory device using a variable resistance material whose resistance level drastically changes according to a bias applied thereto so that the resistance of the material may switch between two different resistance states. Non-limiting examples of the resistive memory device include a Phase-Change Random Access Memory (PCRAM), a Resistive Random Access Memory (RRAM), a Magnetic Random Access Memory (MRAM), a Ferroelectric Random Access Memory (FRAM) and the like.

A resistive memory device has a memory cell array of a cross-point array structure. In a cross-point array structure, memory cells are disposed at cross-points formed by a plurality of lower electrodes (e.g., a plurality of row lines (word lines)) and a plurality of upper electrodes (e.g., a plurality of column lines (bit lines)). Each memory cell has serially coupled resistance variable devices and selection devices.

In a resistive memory device, due to a drift phenomenon, the resistance value may change as time passes after a data is written in a memory cell. Thus, the resistive memory device need a refresh operation for securing the integrity of the stored data.

SUMMARY

Embodiments of the present invention are directed to an improved resistive memory device capable of more effectively refreshing the data stored in memory cells of the resistive memory device.

In accordance with an embodiment of the present invention, a method for operating a memory device including a plurality of memory cells, the method includes: performing a first refresh operation including sequentially applying a recovery pulse to each of the plurality of memory cells and repeating the sequential application of the recovery pulse to each of the plurality of memory cells for a predetermined number of times; and performing a second refresh operation including sequentially re-writing data of each of the plurality of memory cells once after the first refresh operation is performed for the predetermined number of times.

The re-writing of the data of each of the plurality of the memory cells may include: reading the data of each of the memory cells; and re-writing the data in each of the respective memory cells.

Each of the memory cells may include: a resistive memory element; and a selection element.

The resistive memory device may be a phase-change memory device, and the selection device may be an Ovonic Threshold Switch (OTS).

A voltage level of the recovery pulse may be higher than a voltage level that turns on the memory cells.

The voltage level of the recovery pulse may be lower than a voltage level that changes the data of the resistive memory elements of the memory cells.

The predetermined number of times may be a number of times that the recovery pulse is to be applied to each of the memory cells N times, where N is an integer equal to or greater than 1.

In accordance with another embodiment of the present invention, a method for operating a memory controller may include: providing a first refresh command a predetermined number of times to a resistive memory device for controlling the resistive memory device to perform a first refresh operation including sequentially applying a recovery pulse to each of the memory cells of the resistive memory device for the predetermined number of times; and providing a second refresh command to the memory device for controlling the memory device to perform a second refresh operation including sequentially re-writing data of each of the memory cells.

The predetermined operation number may be N rounds, and wherein the first refresh operation may be performed to the memory cells once at each round.

The second refresh operation is performed to the memory cells once. The providing of the first refresh command followed by the second refresh command may repeat.

Each of the memory cells may include: a resistive memory element; and a selection element.

In accordance with yet another embodiment of the present invention, a method for operating a memory controller of a resistive semiconductor system including a memory device operatively coupled to the memory controller, the method may include: providing a refresh command to the memory device a first number of times for controlling the memory device to perform a refresh operation including applying a recovery pulse sequentially to a plurality of memory cells of the memory device for the first number of times; and providing a read command and a write command to the memory device a second number of times by changing an address for controlling the memory device to re-write data of each of the plurality of the memory cells.

The first number may be N rounds, and wherein the refresh operation is performed to the memory cells once at each round.

The second number may be a single round, and the read and write operations may be performed to the memory cells once at the single round.

Each of the memory cells may include: a resistive memory element; and a selection element.

In accordance with still another embodiment of the present invention, a memory device includes: a plurality of memory cells; a read/write circuit suitable for reading data from a selected one among the memory cells, and for writing a data in the selected memory cell; and a recovery pulse applying circuit suitable for applying a recovery pulse to the selected memory cell, wherein a first refresh operation of sequentially applying a recovery pulse to memory cells is performed N rounds and then a second refresh operation of sequentially re-writing data of the memory cells a single round.

Each of the memory cells may include: a resistive memory element; and a selection element.

The resistive memory device may be a phase-change memory device, and the selection device may be an Ovonic Threshold Switch (OTS).

A voltage level of the recovery pulse may be a voltage level that turns on the memory cells.

The voltage level of the recovery pulse may be lower than a voltage level that changes the data of the resistive memory elements of the memory cells.

BRIEF DESCRIPTION OF THE DRAWINGS

The above and other features and advantages of the present invention will become more apparent to those skilled in the art to which the present invention belongs by the following detailed description with reference to the attached drawings in which.

DETAILED DESCRIPTION

Figure 1:
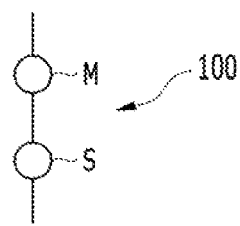
FIG. 1 illustrates a memory cell of a semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more Intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 2:
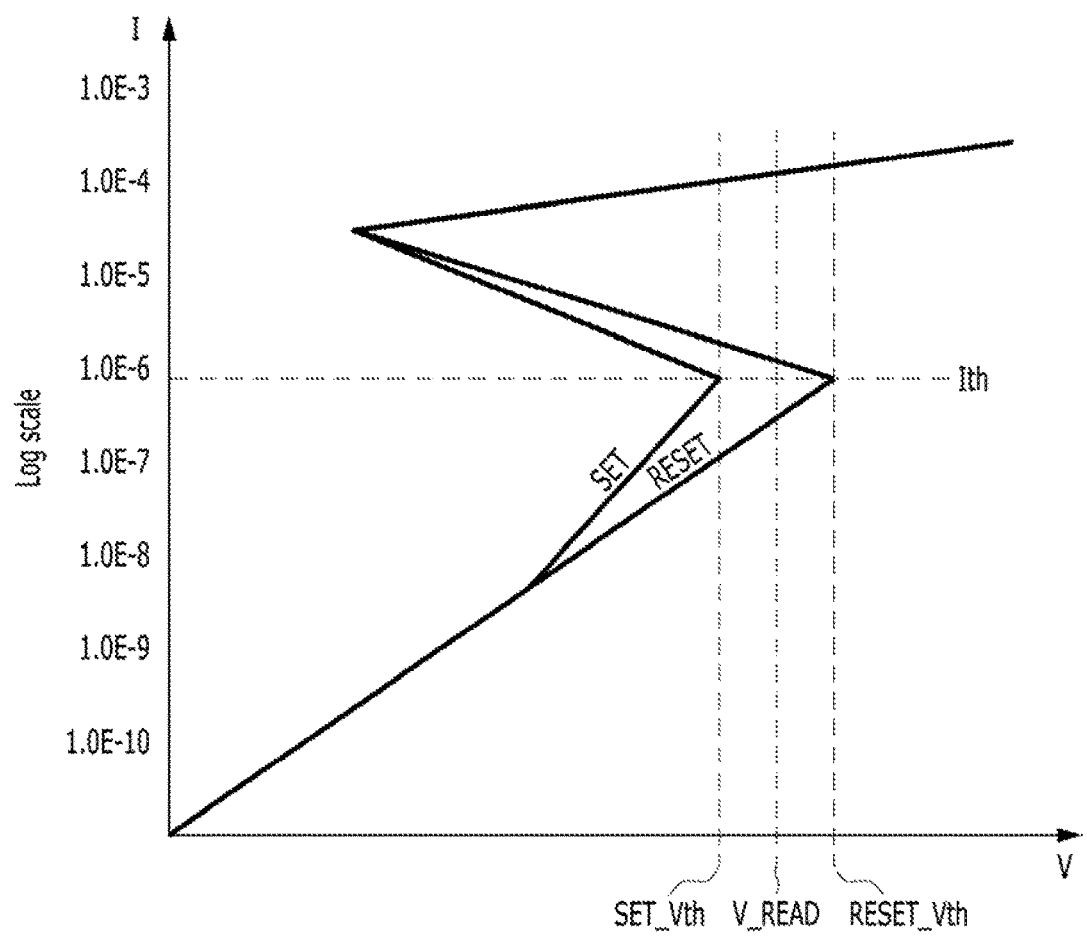
FIG. 2 is a graph showing a current-voltage (I-V) curve of the memory cell of FIG. 1.

FIG. 1 illustrates a memory cell 100 of a semiconductor memory device. FIG. 2 is a graph showing a current-voltage (I-V) curve of the memory cell 100.

Referring to FIG. 1, the memory cell 100 may include a resistive memory element M and a selection element S.

The resistive memory element M may be in either a low resistance state (a 'set' state) or a high resistance state (a 'reset' state) which may represent a stored data such as a "0" or "1". In an embodiment, the resistive memory element M may be a Phase-Change (PC) memory element, wherein a crystalline state of the PC memory element may be the low resistance state and an amorphous state of the PC memory element may be the high resistance state. The PC memory element may be made of a chalcogenide material.

The selection element S has a slight amount of current flow when it is turned off. When the amount of current flowing through a memory cell is equal to or higher than a threshold value Ith, the selection element S is turned on so as to have much more current flow therethrough. After the selection element S is turned on, a snapback phenomenon may occur in the memory cell 100 such that the voltage levels between both ends of the memory cell 100 are decreased. The selection element S may be an Ovonic Threshold Switch (OTS). The selection element S may also be made of a chalcogenide material.

FIG. 2 shows current flowing through the memory cell 100 as a function of the voltage applied between both ends of the memory cell 100. Regardless of whether the memory cell 100 is in a high resistance state (e.g., a "RESET" state in FIG. 2) or a low resistance state (e.g., a "SET" state in FIG. 2), the amount of current flowing through the memory cell 100 is increased, as the level of the voltage applied between both ends of the memory cell 100 is raised. At the same voltage level, more current may flow through the memory cell 100 in the low resistance state (SET) than in the high resistance state (RESET).

When the voltage level between both ends of the memory cell 100 in the low resistance state (SET) reaches a threshold value SET_Vth of the low resistance state (SET) and thus the amount of current flowing through the memory cell 100 in the low resistance state (SET) reaches the threshold value Ith, the selection element S of the memory cell 100 in the low resistance state (SET) is turned on. The turned-on selection element S of the memory cell 100 in the low resistance state (SET) drops the voltage level between both ends of the memory cell 100 and causes drastic increase in the amount of current flowing through the memory cell 100, which is the snapback phenomenon.

When the voltage level between both ends of the memory cell 100 in the high resistance state (RESET) reaches a threshold value RESET_Vth of the high resistance state (RESET) and thus the amount of current flowing through the memory cell 100 in a high resistance state (RESET) reaches the threshold value Ith, the selection element S of the memory cell 100 in the high resistance state (RESET) is turned on. The turned-on selection element S of the memory cell 100 in the high resistance state (RESET) drops the voltage level between both ends of the memory cell 100 and causes drastic increase in the amount of current flowing through the memory cell 100, which is also the snapback phenomenon.

Stored data may be read out from the memory cell 100 through the snapback phenomenon. In a case where a read voltage V_READ, which is higher than the threshold value SET_Vth of the low resistance state and lower than the threshold value RESET_Vth of the high resistance state, is applied between both ends of the memory cell 100, the snapback phenomenon occurs only in a memory cell 100 which is in the low resistance state (SET) and thus a great deal of current flows through the memory cell 100 in the low resistance state (SET). The snapback phenomenon does not occur in a memory cell 100 which is in the high resistance state (RESET) and thus a small amount of current may flow through the memory cell 100 in the high resistance state (RESET). Therefore, in this way, it is possible to know whether the memory cell 100 is in a low resistance state (SET) or a high resistance state (RESET) by applying the read voltage V_READ between both ends of the memory cell 100 and sensing the amount of current flowing through the memory cell 100.

A data may be written (programmed) in the memory cell 100 by applying a sufficient amount of a current to the memory cell 100 to transition the resistive memory element M to a melting state and then decreasing the amount of the current applied to the memory cell 100. By controlling the rate of decrease of the applied current, the resistive memory element M may transform into a solid crystalline or a solid amorphous state representing different programming states. For example, when the current (also referred to hereinafter as a write current) is slowly decreased after the resistive memory element M goes into the melting state, the resistive memory element M of the memory cell 100 may change into a crystalline state and thus the memory cell 100 representing a low resistance stat (SET). When the write current is rapidly decreased after the resistive memory element M goes into the melting state, the resistive memory element M of the memory cell 100 may change into an amorphous state representing a high resistance state (RESET).

Importantly, the resistance values of the resistive memory element M and the selection element S of the memory cell 100 may change as time passes due to a drift phenomenon. In other words, the stored data of the memory cell 100 may be lost due to the drift phenomenon. The memory cell 100 may be recovered from the drift phenomenon by applying a current equal to or higher than the threshold value Ith to the memory cell 100. In short, the memory cell 100 may be recovered from the drift phenomenon by applying a recovery pulse of a voltage level that is equal to or higher than the threshold voltage value RESET_Vth of the high resistance state between both ends of the memory cell 100 so that a current equal to or higher than the threshold value Ith may flow through the memory cell 100.

Figure 3:
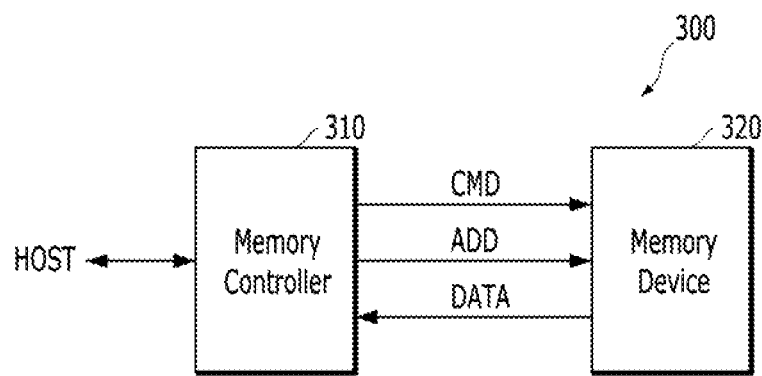
FIG. 3 is a simplified block diagram Illustrating a memory system, in accordance with an embodiment of the present invention.

FIG. 3 is a simplified block diagram Illustrating a memory system 300, in accordance with an embodiment of the present invention.

Referring to FIG. 3, the memory system 300 may include a memory controller 310 and a memory device 320.

The memory controller 310 may control the memory device 320 in such a manner that a stored data is read out from the memory device 320 and a data is written (programmed) In the memory device 320 in response to a respective read or write request received from a host. The memory controller 310 may control the read, write and refresh operations of the memory device 320 by applying respective read, write and refresh commands CMD and addresses ADD to the memory device 320. Data may be transferred between the memory controller 310 and the memory device 320 under the supervisory control of the controller 310. For example, during a read operation, data may be transferred from the memory device 320 to the memory controller 310, whereas during a write operation, data may be transferred from the memory controller 310 to the memory device 320.

The memory system 300 may perform a refresh operation in the memory device 320. The refresh operation may include a first refresh operation and a second refresh operation.

The first refresh operation may prevent a memory cell from losing a data stored therein through recover of the memory cell from the drift phenomenon by applying a recovery pulse between both ends of the memory cell in the inside of the memory device 320. The first refresh operation is performed for a short time and consumes a small amount of current because only the recovery pulse is applied between both ends of the memory cell. However, the data of the memory cell is not re-written (re-programmed) in the memory cell during the first refresh operation.

The second refresh operation may prevent the memory cell from losing a data stored therein by re-writing the data into the memory cell in the inside of the memory device 320. Since an operation of reading a data from the memory cell and an operation of writing the read data back into the memory cell have to be performed during the second refresh operation, the second refresh operation may require a longer operation time and more current consumption, compared with the first refresh operation.

To sum up, the first refresh operation is advantageous in terms of the operation time and current consumption while the second refresh operation provides a better refresh performance.

Figure 4:
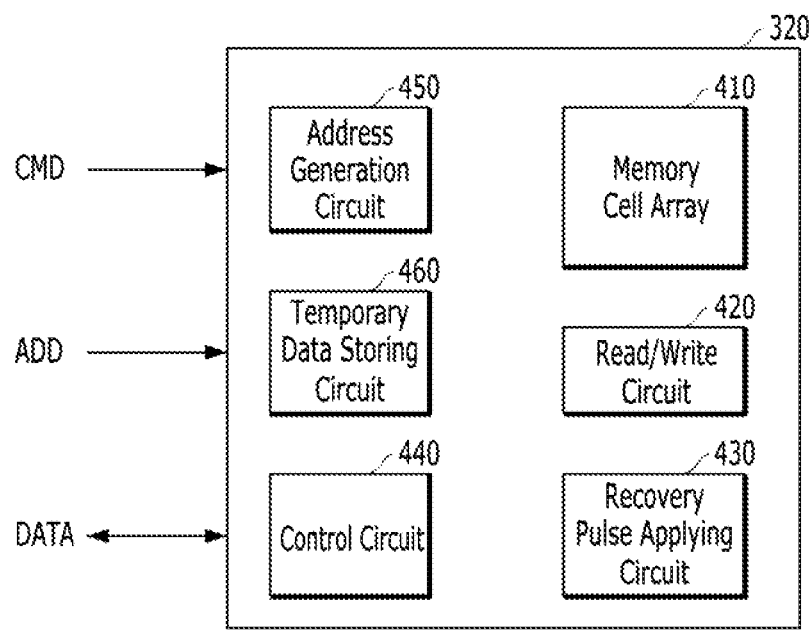
FIG. 4 is a simplified block diagram illustrating an exemplary configuration of a memory device employed in the memory system of FIG. 3.

FIG. 4 is a simplified block diagram illustrating an exemplary configuration of the memory device 320 shown in FIG. 3.

Referring to FIG. 4, the memory device 320 may include a memory cell array 410, a read/write circuit 420, a recovery pulse applying circuit 430, a control circuit 440, an address generation circuit 450, and a temporary data storing circuit 460.

The memory cell array 410 may include a plurality of memory cells such as the memory cell 100 disposed generally at the cross-points formed by a plurality of row lines (word lines) and a plurality of column lines (bit lines). The memory device 320 may also include a row decoder and a column decoder that may select a memory cell to be accessed among the plurality of the memory cells. For example, the row decoder and the column decoder may be part of the memory cell array 410. Among the plurality of the memory cells of the memory cell array 410, the memory cell to be accessed may be selected based on an address ADD applied from the exterior of the memory device 320 during a read operation and/or a write operation. For example, an address may be provided to the memory controller 310 by a host HOST to which the memory system may be operatively coupled with together with a request. The memory controller may then transfer the address ADD to the memory device 320 together with a command CMD corresponding to the received request for the host HOST. During the first refresh operation and the second refresh operation, the memory cell to be accessed may be selected based on an address generated in the address generation circuit 450 using the row and column decoders (not shown). The address generated in the address generation circuit may be based on the received address ADD from the memory controller 310.

The read/write circuit 420 may read the stored data from the selected memory cell or write a data in the selected memory cell. The read operation may be performed by applying a read voltage between both ends of the selected memory cell and then sensing the amount of current flowing through the selected memory cell. The write operation may be performed by applying a write current to the selected memory cell in order for the resistive memory device of the selected memory cell to enter a melting state, and then slowly reducing the level of the write current for the low resistance state (i.e., the crystalline state) or rapidly reducing the level of the write current for the high resistance state (i.e., the amorphous state). The read/write circuit 420 may receive the data DATA, which is to be written into the selected memory cell, from the memory controller 310 during the write operation, and may transfer the data DATA, which is read from the selected memory cell, to the memory controller 310 during the read operation.

The recovery pulse applying circuit 430 may apply a recovery pulse between both ends of the selected memory cell of the memory cell array 410.

The address generation circuit 450 may generate an address for selecting a memory cell, to which a refresh operation is to be performed, in the memory cell array 410 during the first refresh operation and/or the second refresh operation. The address generated in the address generation circuit 450 may change for each refresh operation in order to sequentially refresh the memory cells of the memory cell array 410.

The temporary data storing circuit 460 may temporarily store the data that is read out of the memory cell array 410 during the second refresh operation. The temporarily stored data of the temporary data storing circuit 460 may be re-written in the memory cell array 410.

The control circuit 440 may control the memory cell array 410, the read/write circuit 420, the recovery pulse applying circuit 430 and the temporary data storing circuit 460 to perform a read operation, a write operation, a first refresh operation, and/or a second refresh operation in response to corresponding first refresh and second refresh commands received from the memory controller 310. The control circuit 440 may decode a command CMD transferred from the memory controller 310 to detect what operation is commanded by the memory controller 310.

Figure 5:
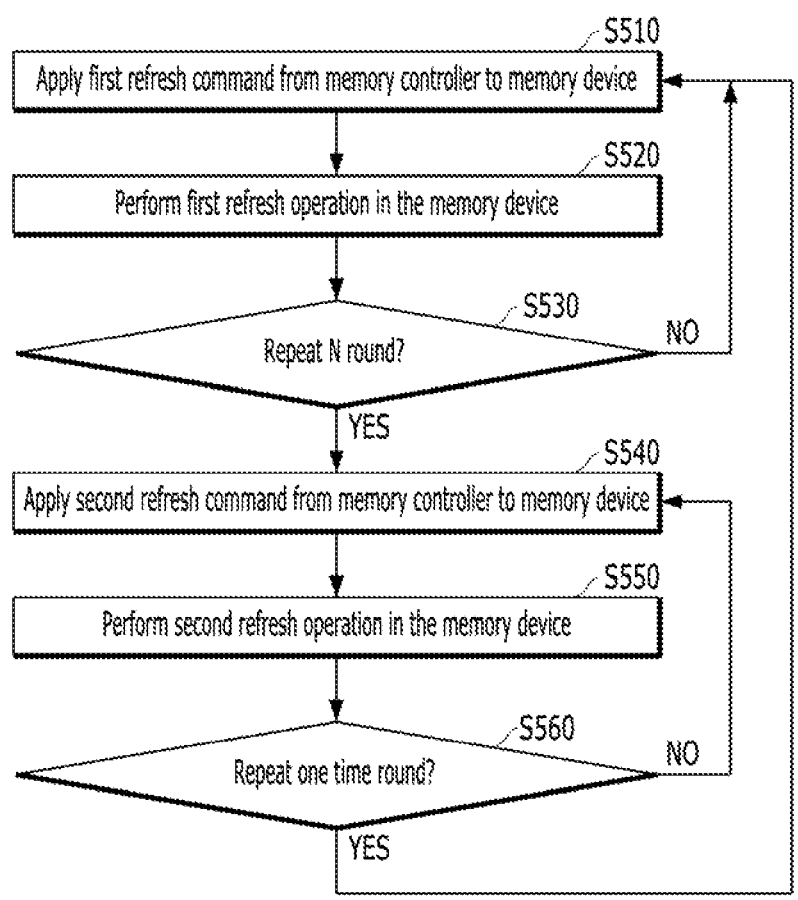
FIG. 5 is a flowchart describing an operation of the memory system of FIG. 3, according to an embodiment of the present invention.

FIG. 5 is a flowchart describing an operation of the memory system 300 according to an embodiment of the present invention.

Referring to FIG. 5, in step S510, the memory controller 310 generates and provides a first refresh command to the memory device 320.

A first refresh operation may then be performed in the memory device in response to the first refresh command in step S520. During the first refresh operation, the recovery pulse applying circuit 430 applies a recovery pulse to a memory cell that is selected according to an address generated in the address generation circuit 450 among the plurality of the memory cells of the memory cell array 410.

The first refresh operation may be performed N rounds in the memory device 320. Herein, during one round, all the memory cells in the memory device 320 are refreshed once. If N is set to 2 (N=2) and the first refresh operation has to be performed 1000 times to refresh all the memory cells of the memory device 320 once during a single round, the steps S510 and S520 may be repeated 2000 times.

After the first refresh operation is performed N rounds (which is 'YES' in step S530), the memory controller 310 may generate and provide a second refresh command to the memory device 320 in step S540.

In step S550, the memory device 320 may perform a second refresh operation in response to the second refresh command. During the second refresh operation, the read/write circuit 420 reads the data of a memory cell that is selected according to an address generated in the address generation circuit 450 among the plurality of the memory cells of the memory cell array 410, stores the read data in the temporary data storing circuit 460, and writes the temporarily stored data back into the selected memory cell. In short, the second refresh operation may include performing first a read operation and then a write operation to the selected memory cell.

The second refresh operation may be repeatedly performed until the second refresh operation is performed one round in the memory device 320.

After the second refresh operation is performed one round (which is 'YES' in step S560), the first refresh operation may be performed again.

In short, the second refresh operation may be performed a single round whenever the first refresh operation is performed N rounds in the memory device 320. According to the embodiment of the present invention shown in FIG. 5, it is possible to secure data stability of the memory device 320 by performing the second refresh operation while preventing performance degradation of the memory device 320 and reducing power consumption by performing the first refresh operation.

Although FIG. 5 shows the operation related to the refresh operation of the memory device 320, it is obvious to those skilled in the art that a read operation and/or a write operation may be performed in the memory device 320 under the control of the memory controller 310 between the refresh operations.

Figure 6:
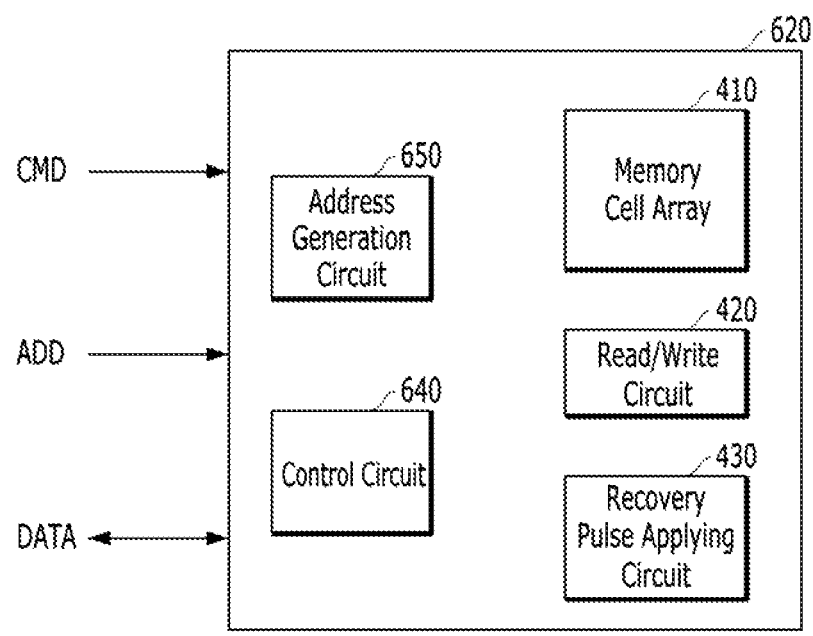
FIG. 6 is a simplified block diagram illustrating another exemplary configuration of the memory device employed in the memory system of FIG. 3.

FIG. 6 is a simplified block diagram illustrating another exemplary configuration of the memory device 620. The memory device 620 shown in FIG. 6 may support the second refresh operation differently from the memory device 320 of FIG. 4.

Referring to FIG. 6, the memory device 620 may include the memory cell array 410, the read/write circuit 420, the recovery pulse applying circuit 430, a control circuit 640, and an address generation circuit 650.

The address generation circuit 650 may generate an address for selecting a memory cell, to which a refresh operation is to be performed, in the memory cell array 410 during the first refresh operation. It is noted that the memory device 620 does not support performing the second refresh operation in response to a second refresh command, hence unlike the address generation circuit 450 of the memory device 320 of FIG. 4 the address generation circuit 650 does not generate an address for performing a second refresh operation.

The control circuit 640 may control the memory cell array 410, the read/write circuit 420 and the recovery pulse applying circuit 430 to perform a read operation, a write operation, and/or a first refresh operation in response to commands from the memory controller 310.

Figure 7:
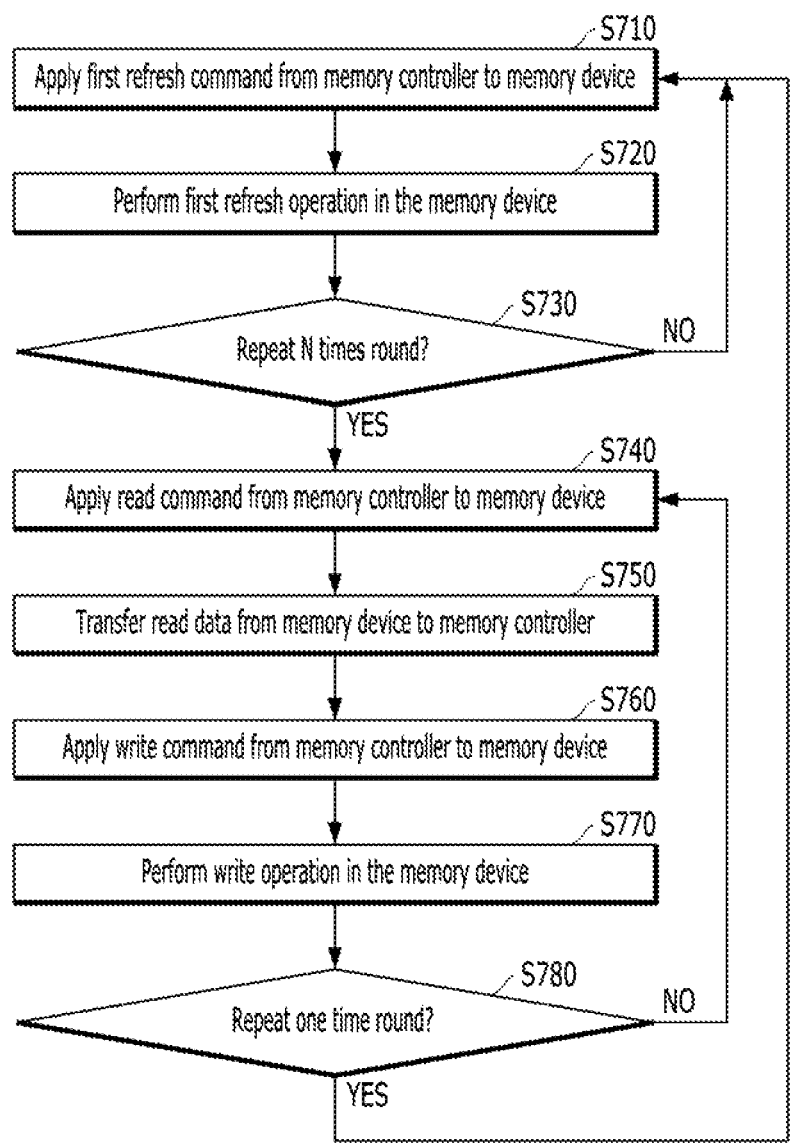
FIG. 7 is a flowchart describing an operation of the memory system of FIG. 3, according to another embodiment of the present invention.

FIG. 7 is a flowchart describing an operation of a memory system 300 which employs the memory device 620 instead of the memory device 320.

Referring to FIG. 7, in step S710, the memory controller 310 generates and provides a first refresh command to the memory device 620.

The memory device 620 may then perform a first refresh operation in response to the first refresh command in step S720. During the first refresh operation, the recovery pulse applying circuit 430 applies a recovery pulse to a memory cell that is selected according to an address generated in the address generation circuit 650 among the plurality of the memory cells of the memory cell array 410.

The first refresh operation may be performed N rounds in the memory device 620. After the first refresh operation is performed N rounds (which is 'YES' in step S730), the memory controller 310 may control the memory device 620 to perform a second refresh operation. The memory controller 310 may control the memory device 620 to perform a second refresh operation through a read operation and a write operation.

Specifically, in step S740, the memory controller 310 may apply a read command to the memory device 620. The memory controller 310 may also apply an address to the memory device 620 along with the read command.

In step S750, a read operation may be performed in the memory device 620 in response to the read command, and a read data may be transferred from the memory device 620 to the memory controller 310.

In step S760, the memory controller 310 may apply a write command to the memory device 620. The memory controller 310 may also transfer the read data of step S750 to the memory device 620 as a write data along with the write command. Also, the memory controller 310 may apply the address of step S740 to the memory device 620 along with the write command.

In step S770, a write operation is performed in the memory device 620 in response to the write command. In this way, the read data of the step S750 may be re-written in the same memory cell of the step S750. In short, the second refresh operation may be performed through the read operation and the write operation to the same memory cell.

The operations of the steps S740 to S770 may be performed repeatedly until the second refresh operation is performed one round. The address for both of the read and write operations may change whenever the operations of the steps S740 to S770 are repeated.

After the second refresh operation is performed one round (which is 'YES' in step S780), the first refresh operation may be performed again.

In short, the second refresh operation may be performed a single round whenever the first refresh operation is performed N rounds in the memory device 620. According to the embodiment of the present invention shown in FIG. 7, it is possible to secure data stability of the memory device 620 by performing the second refresh operation while preventing performance degradation of the memory device 620 and reducing power consumption by performing the first refresh operation.

According to embodiments of the present invention, a resistive memory device is provided which may more effectively refresh its memory cells.

While the present invention has been described with respect to specific embodiments, it will be apparent to those skilled in the art that various changes and modifications may be made without departing from the spirit and scope of the invention as defined in the following claims.

What is claimed is:

1. A method for operating a memory device comprising a plurality of memory cells, the method comprising:
   performing a first refresh operation comprising sequentially applying a recovery pulse to each of the plurality of memory cells and repeating the sequential application of the recovery pulse to each of the plurality of memory cells for a predetermined number of times equal to or greater than 1; and
   performing a second refresh operation comprising sequentially re-writing data of each of the plurality of memory cells once after the first refresh operation is performed for the predetermined number of times.

2. The method of claim 1, wherein the re-writing of the data of each of the plurality of the memory cells includes:
   reading the data of each of the memory cells; and
   re-writing the data in each of the respective memory cells.

3. The method of claim 1, wherein each of the memory cells includes:
   a resistive memory element; and
   a selection element.

4. The method of claim 3, wherein the resistive memory element is a phase-change memory element, and the selection element is an Ovonic Threshold Switch (OTS).

5. The method of claim 4, wherein a voltage level of the recovery pulse is higher than a voltage level that turns on the memory cells.

6. The method of claim 5, wherein the voltage level of the recovery pulse is lower than a voltage level that changes the data of the resistive memory elements.

7. The method of claim 1, wherein the first refresh operation is performed to the memory cells once each time.

8. A method for operating a memory controller, comprising:
   providing a first refresh command a predetermined number of times equal to or greater than 2 to a resistive memory device for controlling the resistive memory device to perform a first refresh operation comprising sequentially applying a recovery pulse to each of the memory cells of the resistive memory device for the predetermined number of times; and
   providing a second refresh command to the memory device for controlling the memory device to perform a second refresh operation comprising sequentially re-writing data of each of the memory cells.

9. The method of claim 8, wherein the first refresh operation is performed to the memory cells once each time.

10. The method of claim 9,
wherein the second refresh operation is performed to the memory cells once,
further comprising repeating the providing of the first refresh command and the providing of the second refresh command.

11. The method of claim 8, wherein each of the memory cells includes:
a resistive memory element; and
a selection element.

12. A method for operating a memory controller of a resistive semiconductor system comprising a memory device operatively coupled to the memory controller, the method comprising:
providing a refresh command to the memory device a first number of times equal or greater than 2 for controlling the memory device to perform a refresh operation comprising applying a recovery pulse sequentially to a plurality of memory cells of the memory device for the first number of times; and
providing a read command and a write command to the memory device a second number of times by changing an address for controlling the memory device to re-write data of each of the plurality of the memory cells.

13. The method of claim 12, wherein the refresh operation is performed to the memory cells once each time.

14. The method of claim 13,
wherein the second number is a single round, and
wherein the read and write operations are performed to the memory cells once at the single round.

15. The method of claim 12, wherein each of the memory cells includes:
a resistive memory element; and
a selection element.

16. A memory device, comprising:
a plurality of memory cells;
a read/write circuit suitable for reading data from a selected one among the memory cells, and for writing a data in the selected memory cell; and
a recovery pulse applying circuit suitable for applying a recovery pulse to the selected memory cell, wherein a first refresh operation of sequentially applying a recovery pulse to memory cells is performed at least 2 times and then a second refresh operation of sequentially re-writing data of the memory cells a single round.

17. The memory device of claim 16, wherein each of the memory cells includes;
a resistive memory element; and
a selection element.

18. The memory device of claim 17, wherein the resistive memory element is a phase-change memory device, and the selection element is an Ovonic Threshold Switch (OTS).

19. The memory device of claim 18, wherein a voltage level of the recovery pulse is a voltage level that turns on the memory cells.

20. The memory device of claim 19, wherein the voltage level of the recovery pulse is lower than a voltage level that changes the data of the resistive memory elements of the memory cells.

* * * * *